(12) United States Patent
Ohkubo et al.

(10) Patent No.: US 6,600,174 B2
(45) Date of Patent: Jul. 29, 2003

(54) LIGHT RECEIVING ELEMENT AND SEMICONDUCTOR LASER DEVICE

(75) Inventors: Isamu Ohkubo, Kashiba (JP); Kazuhiro Natsuaki, Sakurai (JP); Naoki Fukunaga, Soraku-gun (JP); Masaru Kubo, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 205 days.

(21) Appl. No.: 09/757,473

(22) Filed: Jan. 11, 2001

(65) Prior Publication Data
US 2002/0044580 A1 Apr. 18, 2002

(30) Foreign Application Priority Data

Jan. 24, 2000 (JP) ........................................ 2000-013771

(51) Int. Cl.⁷ .......................... H01L 31/00; H01L 29/40
(52) U.S. Cl. .......................... 257/81; 257/459; 257/764; 257/765; 257/767; 257/771; 257/784
(58) Field of Search .............................. 257/80, 81, 82, 257/84, 751, 753, 764, 765, 771, 784, 459, 752, 763, 767

(56) References Cited

U.S. PATENT DOCUMENTS 6,127,715 A 10/2000 Yamamoto et al. ......... 257/459

FOREIGN PATENT DOCUMENTS

JP          7-142813       6/1995
JP          9-97892        4/1997

Primary Examiner—Minh Loan Tran

(57) ABSTRACT

A corrosion-resistant conductive layer (TiW layer) formed of a corrosion-resistant material is formed to extend from a bonding pad portion to an interconnection portion of a light receiving element. A semiconductor laser device according to the present invention includes the light receiving element.

9 Claims, 7 Drawing Sheets

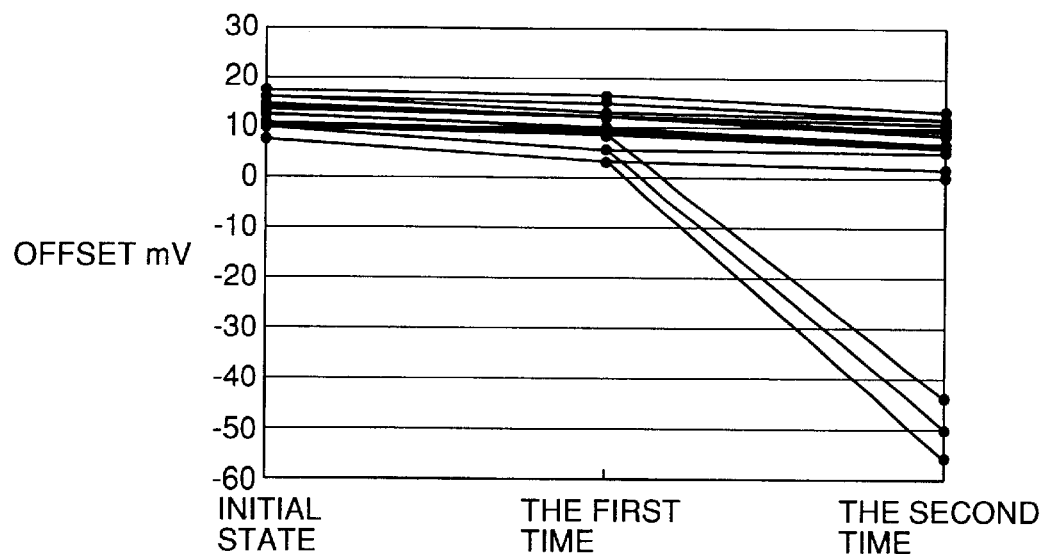
FIG.4A <THE PRESENT INVENTION>
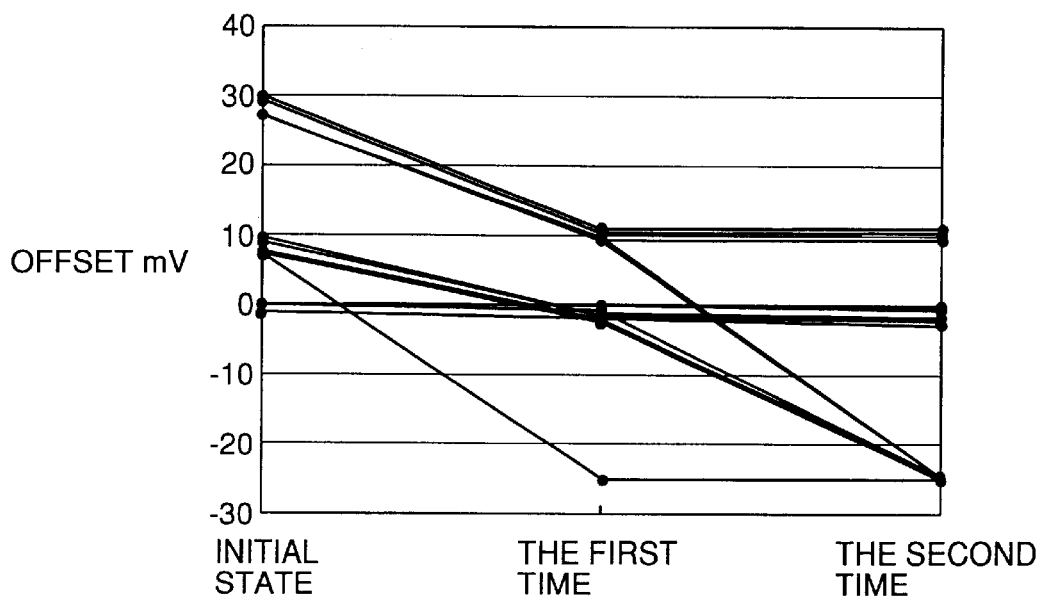
FIG.4B <CONVENTIONAL EXAMPLE>

US 6,600,174 B2

LIGHT RECEIVING ELEMENT AND SEMICONDUCTOR LASER DEVICE

BACKGROUND OF THE INVENTION

1. Field of the Invention

The present invention relates to a light receiving element and a semiconductor laser device, and more particularly to a configuration of a light receiving element utilized for a pickup or the like of an optical disk and to a semiconductor laser device including the light receiving element.

2. Description of the Background Art

A semiconductor laser device utilized for a pickup of an optical disk has conventionally been known. An example of such a semiconductor laser device is shown in FIG. 5.

The semiconductor laser device shown in FIG. 5 is disclosed in Japanese Patent Laying-Open No. 7-142813, and includes a stem platform 9 and a stem 11 fixed to stem platform 9. A semiconductor laser chip 17 is attached to the side surface of stem 11, a photodiode chip for detection is attached to the top surface, and a photodiode (light receiving element) 16 is attached onto stem platform 9.

A cap 12 having a window 13 is fixed to stem platform 9. Glass 10 is mounted on cap 12 and fixed to cap 12 by bonding resin 14.

A vent hole 15 is provided on stem platform 9, which allows emission of moisture even when the moisture is externally introduced into a space within cap 12 through bonding resin 14.

However, the semiconductor laser device has a problem such that moisture entered into the space described above from vent hole 15 corrodes a metal portion unprotected by a surface protection film, such as a bonding pad portion of photodiode (light receiving element) 16.

An example of a light receiving element capable of addressing such a problem is a light receiving element disclosed in Japanese Patent Laying-Open No. 9-97892. The light receiving element described in this publication is shown in FIG. 6.

Referring to FIG. 6, the light receiving element includes a bonding pad portion 20, a photodiode portion 21 and a signal processing circuit portion 22. Bonding pad portion 20 electrically connects, for example, photodiode portion 21 and signal processing circuit portion 22, photodiode portion 21 detecting received light, and signal processing circuit portion 22 processing a light signal.

The light receiving element further includes a semiconductor substrate 1, and an oxide film 2 formed thereon. Semiconductor substrate 1 includes a p-type semiconductor substrate 1a and an n-type epitaxial layer 1b. Various impurity diffusion layers are formed, and a metal layer (an electrode) connected to a predetermined impurity diffusion layer is also formed within semiconductor substrate 1.

Bonding pad portion 20 is constituted by a part of a metal layer 4a formed on oxide film 2, a part of the surface of bonding pad portion 20 not being covered by a surface protection film 5. A metal layer having corrosion resistance such as TiW layer 7 and Au layer 8 is formed on the part of the surface. Au layer 8 is formed in order to enhance the bonding property.

By forming the metal layer having corrosion resistance such as TiW layer 7 on bonding pad portion 20 as described above, corrosion of bonding pad portion 20 can be inhibited even if moisture enters into the space within cap 12 from vent hole 15 as described earlier.

However, the conventional example shown in FIG. 6 also has a problem described below. This problem is described with reference to FIG. 7. FIG. 7 is an enlarged view of bonding pad portion 20 and portions adjacent thereto.

Referring to FIG. 7, a bonding wire 6 is formed on bonding pad portion 20. If there is a projection on, for example, the surface of metal layer 4a, TiW layer 7 or Au layer 8 is damaged at the time of bonding of bonding wire 6, so that metal layer 4a located underneath TiW layer 7 is corroded, and thus a corrosion region 18 is locally generated as shown in FIG. 7. Corrosion region 18 is generated mainly at the periphery of bonding wire 6, and if corrosion region 18 reaches interconnection portion 23, a problem may be raised such that bonding wire 6 and an interconnection portion 23 are not electrically conducted. This problem may also occur if TiW layer 7 or the like is damaged by contacting a probe with TiW layer 7 in a product test.

SUMMARY OF THE INVENTION

The present invention is directed to solve the problems described above. It is an object of the present invention to enhance corrosion resistance of a light receiving element.

According to one aspect of the present invention, a light receiving element includes a bonding pad portion, an interconnection portion extending from the bonding pad portion, a corrosion-resistant conductive layer formed of a corrosion-resistant material and extending from the bonding pad portion to the interconnection portion, and a bonding wire formed on the bonding pad portion. The corrosion-resistant conductive layer herein typically represents a conductive layer formed of a material having low corrosiveness (hard-to-corrode property) to a corrosive factor such as moisture, compared to materials constituting the bonding pad portion and the interconnection portion.

By extending the corrosion-resistant conductive layer from the bonding pad portion to the interconnection portion as described above, the interconnection portion and the bonding wire can be electrically connected by the corrosion-resistant conductive layer even if the bonding pad portion located on the periphery of the bonding wire is corroded.

The light receiving element according to the present invention includes a protection film having an opening on the bonding pad portion and covering the interconnection portion, the corrosion-resistant conductive layer extending underneath the protection film.

By thus forming the corrosion-resistant conductive layer such that it extends to the underneath the protection film, the bonding pad portion and the interconnection portion can be electrically connected by the corrosion-resistant conductive layer, and hence the effect described above can be obtained.

Further, an additional corrosion-resistant conductive layer may be formed between the bonding pad portion and the bonding wire.

This can inhibit corrosion of the bonding pad portion itself located on the periphery of the bonding wire, and can further ensure connection between the interconnection portion and the bonding wire.

The bonding pad portion and the interconnection portion are formed on an insulating film, and a corrosion-resistant conductive layer is arranged to be in contact with the insulating film.

By thus arranging the corrosion-resistant conductive layer on the insulating film side, the corrosion-resistant conductive layer can be protected by the bonding pad portion. Further, adhesion strength between the insulating film and the corrosion-resistant conductive layer can be maintained even if the bonding pad portion located on the periphery of the bonding wire is corroded. As a result, defections of the bonding pad portion can effectively be inhibited.

According to another aspect of the present invention, a light receiving element includes an Al alloy layer formed on an insulating film, a protection film having an opening on a part of the surface of the Al alloy layer and covering the Al alloy layer, and a bonding wire formed on a part of the surface of the Al alloy layer. The Al alloy layer then includes a TiW layer extending from underneath the opening to underneath the protection film.

By extending the TiW layer, which is an example of a corrosion-resistant conductive layer, from underneath the opening to underneath the protection film as described above, the Al alloy layer located underneath the protection film and the bonding wire can be electrically connected by TiW layer, even if the Al alloy layer located underneath the opening is locally corroded. Further, an Al alloy usable as an interconnection material of a circuit portion in the light receiving element, and TiW usable as a barrier metal in the circuit portion are used, so that no further complicated processes are required. Thus, the element can be offered at a low cost.

The TiW layer is formed underneath the Al alloy layer to be in contact with the insulating film, and further, TiW layer and Au layer are preferably formed between the Al alloy layer and the bonding wire. This can inhibit corrosion of the Al alloy layer located underneath the opening, and can further ensure the electrical connection between the Al alloy layer and the bonding wire.

The light receiving element preferably includes a signal processing circuit. Thus, a light receiving element incorporating the signal processing circuit can be improved in its corrosion resistance.

A semiconductor laser device according to the present invention includes the light receiving element described above. Thus, the semiconductor laser device can also be improved in its corrosion resistance.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4A shows a result of a corrosion test of a bonding pad portion in the light receiving element of the present invention, whereas FIG. 4B shows a result of a corrosion test of a bonding pad portion in a conventional light receiving element;

DESCRIPTION OF THE PREFERRED EMBODIMENTS

Embodiments of the present invention will be described below with reference to FIGS. 1 to 4.

(First Embodiment)

Figure 6:
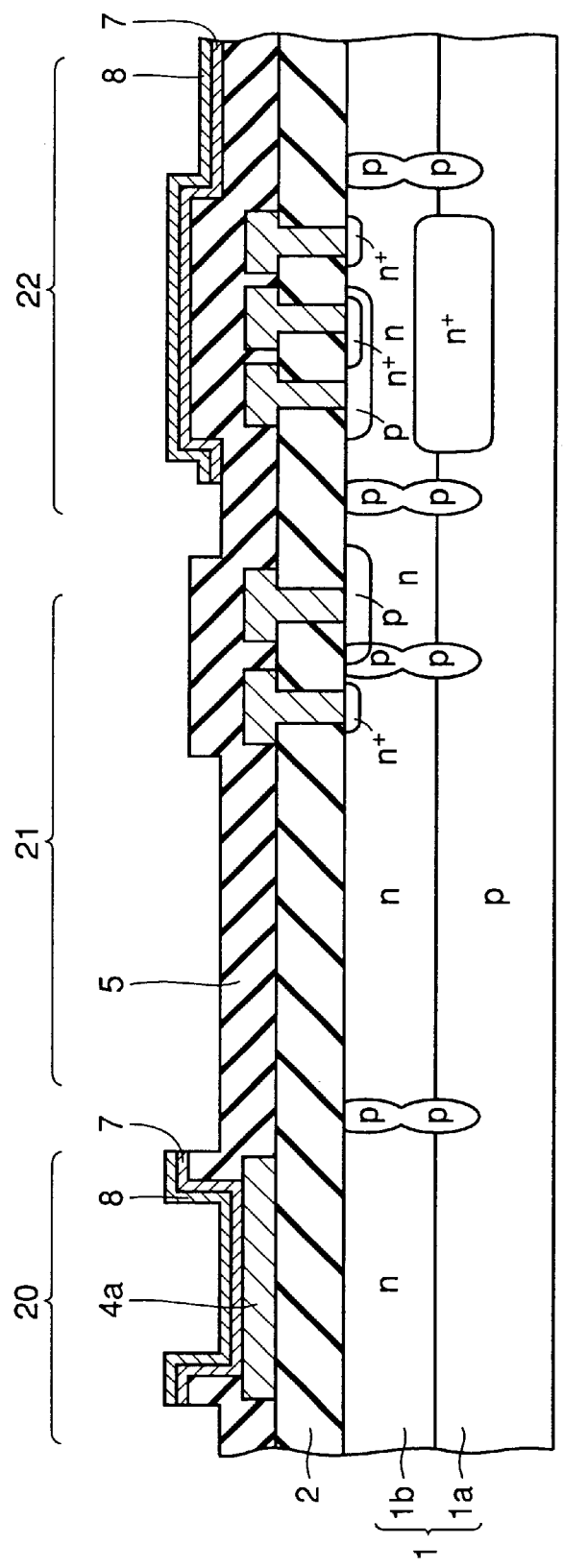
FIG. 6 is a section view of a conventional light receiving element.

A light receiving element according to the first embodiment includes, as in the conventional example shown in FIG. 6, a bonding pad portion 20, a photodiode portion 21 and a signal processing circuit portion 22. Configurations of photodiode portion 21 and signal processing circuit portion 22 are similar to those of the conventional example shown in FIG. 6, so that the descriptions thereof will not be repeated. The light receiving element can be formed by a conventional semiconductor process.

Figure 1:
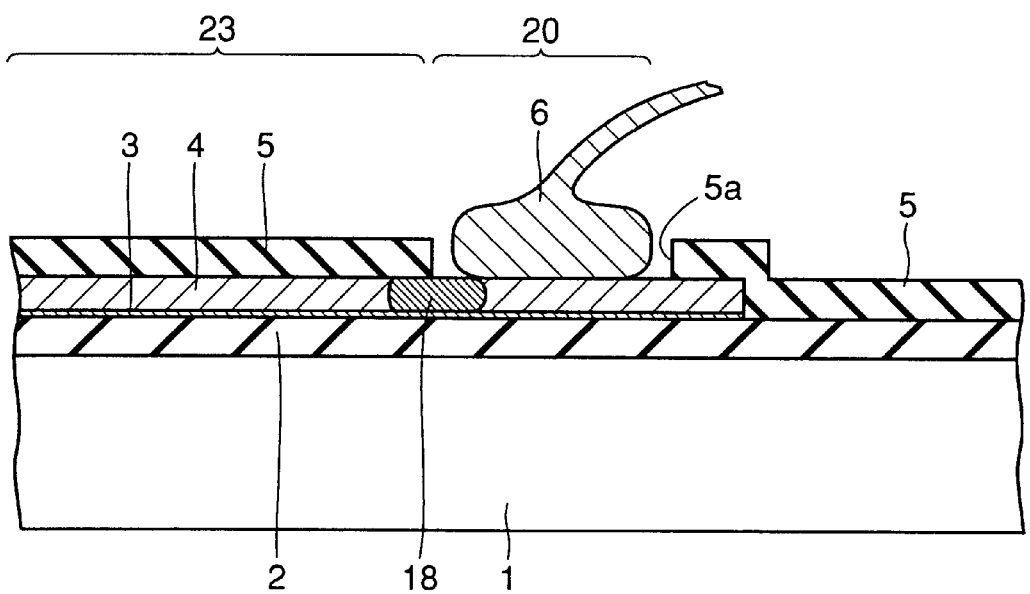
FIG. 1 is a partial section view of a light receiving element according to the first embodiment of the present invention.

FIG. 1 is a section view showing bonding pad portion 20 and interconnection portion 23 in the light receiving element according to the first embodiment of the present invention.

Referring to FIG. 1, the light receiving element according to the present invention includes a semiconductor substrate 1, an oxide film (an insulating film) 2 formed of a silicon oxide film or the like, an AlSi layer (an interconnection layer) 4, a surface protection film 5 formed of a silicon nitride film or the like, and a bonding wire 6 formed of Au or the like.

AlSi layer 4 includes a bonding pad portion 20 electrically connecting photodiode portion 21 and signal processing circuit portion 22, an interconnection portion extending from this bonding pad portion 20 to the periphery, and TiW layer 3 extending from bonding pad portion 20 to interconnection portion 23 and having higher corrosion resistance to moisture compared to AlSi layer 4. Bonding pad portion 20 is formed by a part of AlSi layer 4, and has, for example, a rectangular planar shape. In such a case, a narrow portion extending from the rectangular portion forms interconnection portion 23 described above.

As such, an Al alloy usable as an interconnection material for an circuit portion in the light receiving element and TiW usable as a barrier metal in the circuit portion are used, so that no further complicated processes are required, and thus the element can be offered at a low cost.

Though TiW layer 3 was described as an example of a conductive layer having corrosion resistance, a material other than TiW layer 3 may also be employed as long as it is a conductive layer having corrosion resistance higher than that of AlSi layer 4 (interconnection layer). Further, an Al alloy layer other than AlSi layer, Al layer or the like may be used as an interconnection layer in place of AlSi layer 4.

By extending a corrosion-resistant conductive layer of TiW layer 3 from bonding pad portion 20 to interconnection portion 23 as described above, interconnection portion 23 and bonding wire 6 can be electrically connected by TiW layer 3 even if bonding pad portion 20 is locally corroded and thus corrosion region 18 is generated as shown in FIG. 1. This can enhance corrosion resistance of the light receiving element.

Figure 7:
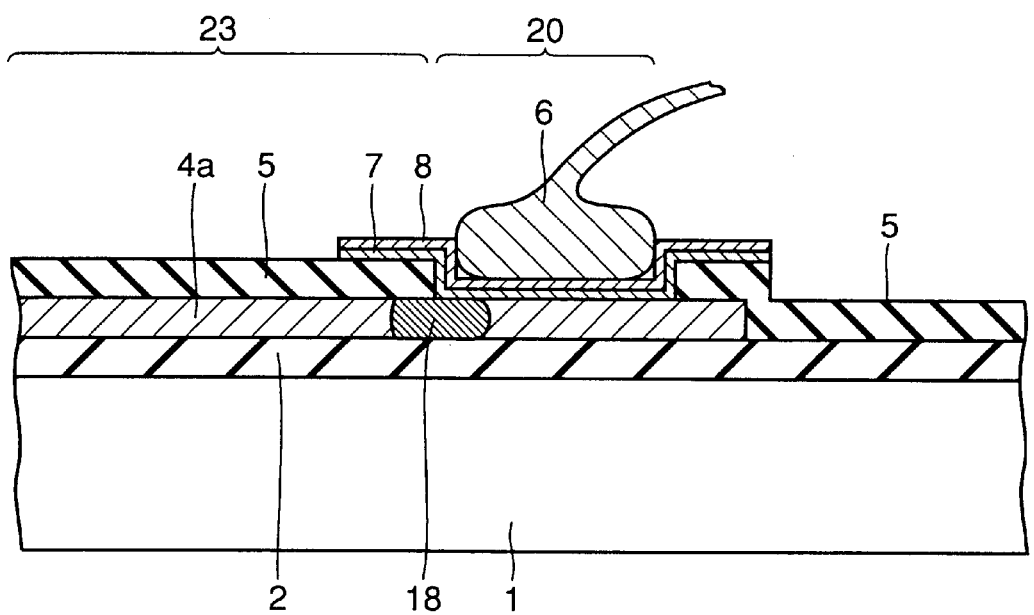
FIG. 7 is a partial section view of the conventional light receiving element.

Further, by forming TiW layer 3, TiW layer 7 and Au layer 8 formed between bonding pad portion 20 and bonding wire 6 in the conventional example shown in FIG. 7 can be dispensed with. This can eliminate the need for providing additional processes to form such layers, resulting in reduction of manufacturing cost of the light receiving element.

In the example shown in FIG. 1, TiW layer 3 is arranged underneath AlSi layer 4 to be in contact with oxide film 2. This can inhibit a crack or the like in TiW layer 3 as occurred in the conventional example, and thus can further ensure connection between bonding pad portion 20 and interconnection portion 23 by TiW layer 3.

Further, adhesion strength of oxide film 2 and TiW layer 3 can be maintained even when bonding pad portion 20 is corroded. Thus, defects of bonding pad portion 20 can be inhibited.

It is noted that TiW layer 3 may be formed such that it extends within or over AlSi layer 4, as long as it extends from bonding pad portion 20 to interconnection portion 23.

Surface protection film 5 has an opening 5a on bonding pad portion 20 and covers interconnection portion 23. TiW layer 3 extends to underneath this surface protection film 5. This allows electrical connection between bonding pad portion 20 and interconnection portion 23 by TiW layer 3, even if corrosion region 18 reaches interconnection portion 23.

A method of manufacturing the light receiving element shown in FIG. 1 is now described with reference to FIG. 2. FIGS. 2A to 2C are section views showing the first to third steps of the manufacturing process of the light receiving element shown in FIG. 1.

Figure 2A:
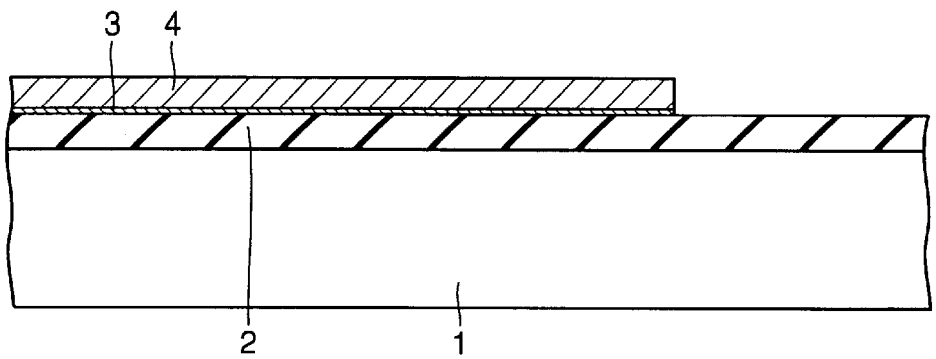
FIGS. 2A to 2C are section views showing the first to third steps of a manufacturing process of the light receiving element shown in FIG. 1.

Referring to FIG. 2A, oxide film 2 is formed on semiconductor substrate 1 formed through a conventional semiconductor process, by a CVD (Chemical Vapor Deposition) method or the like. TiW layer 3 is formed on oxide film 2 by a sputtering method or the like. AlSi layer 4 is formed on TiW layer 3 by the sputtering method or the like. Then, photolithography and etching processes are used to pattern AlSi layer 4 to a predetermined shape.

More specifically, the patterning is performed such that the portion to be bonding pad portion 20 has a rectangular shape and the portion to be interconnection portion 23 is narrower than bonding pad portion 20. At the same time, TiW layer 3 is also patterned to the same shape as that of AlSi layer 4.

Figure 2B:
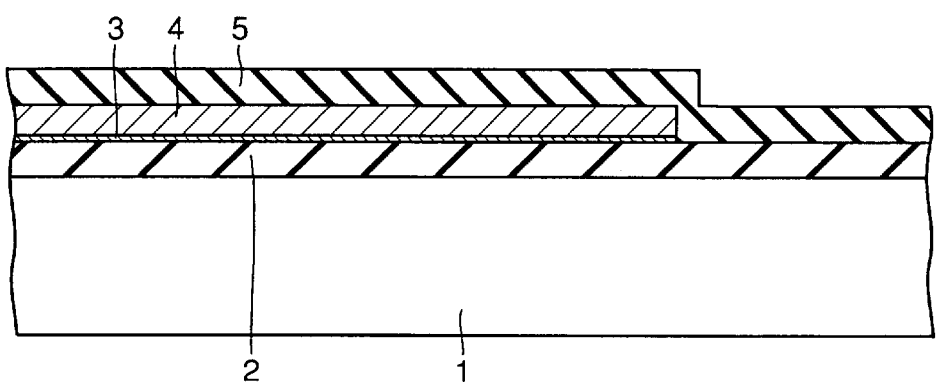

Thereafter, as shown in FIG. 2B, surface protection film 5 formed of a silicon nitride film or the like is formed to cover AlSi layer 4. Surface protection film 5 is provided for the purpose of preventing corrosion of AlSi layer 4, and formed, for example, by the CVD method or the like.

Figure 2C:
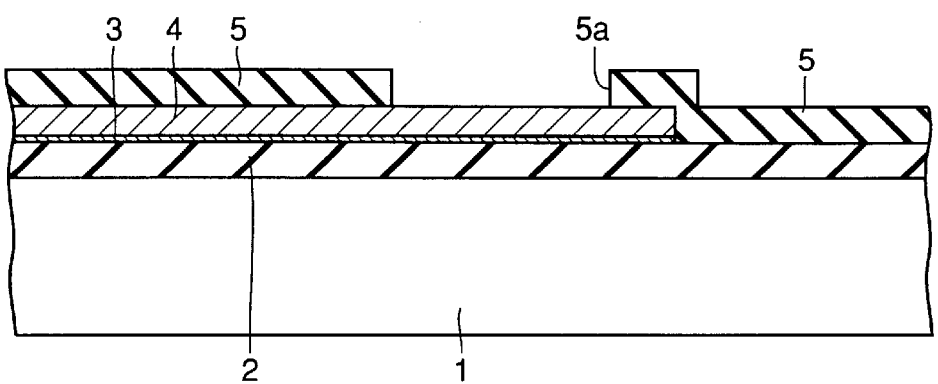

Subsequently, as shown in FIG. 2C, the photolithography and etching processes are used to form opening 5a, exposing a part of the surface of bonding pad portion 20, in surface protection film 5. Bonding wire 6 formed of Au or the like is formed in this opening 5a by a wire bonding method. Through the steps described above, a structure shown in FIG. 1 is obtained.

Results of a corrosion resistance test performed for the light receiving element according to the present embodiment and for the conventional light receiving element of the type shown in FIG. 7 are now shown in FIG. 4. This corrosion resistance test was performed as an acceleration test for the purpose of testing limits of the devices. More specifically, the corrosion resistance test was performed by immersing the devices in tap water and then applying current of 500 $\mu$A for 30 minutes to the devices with wet surfaces. The devices were repeatedly energized after the immersion for emphasizing the results.

As shown in FIG. 4, the light receiving element according to the present embodiment had 0 failures on the first test and 3 failures on the second test, whereas the conventional light receiving element had 6 failures on the first test and 10 failures on the second test. This shows that the present invention obviously enhances the corrosion resistance of the light receiving element.

(Second Embodiment)

Figure 3:
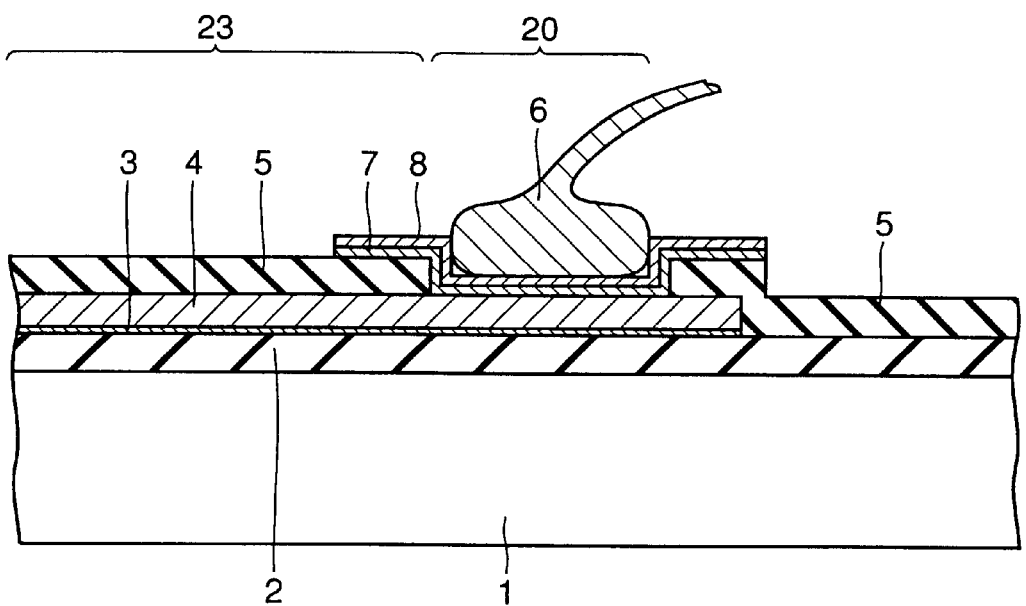
FIG. 3 is a partial section view of a light receiving element according to the second embodiment of the present invention.

FIG. 3 is a section view showing bonding pad portion 20 and interconnection portion 23 in a light receiving element according to the second embodiment of the present invention.

Referring to FIG. 3, TiW layer 7 and Au layer 8 may further be formed between bonding pad portion 20 and bonding wire 6. This can inhibit corrosion of bonding pad portion 20 located on the periphery of bonding wire 6, and further ensures connection between interconnection portion 23 and bonding wire 6.

Though a structural example of the light receiving element according to the present invention has been described as above, the receiving element may be used, for example, in a semiconductor laser device. The structure of the semiconductor laser device may be similar to that shown in FIG. 5. By providing the light receiving element according to the present invention in the semiconductor laser device, the corrosion resistance of the semiconductor laser device can be enhanced, and thus the reliability of the semiconductor laser device can also be enhanced.

Figure 5:
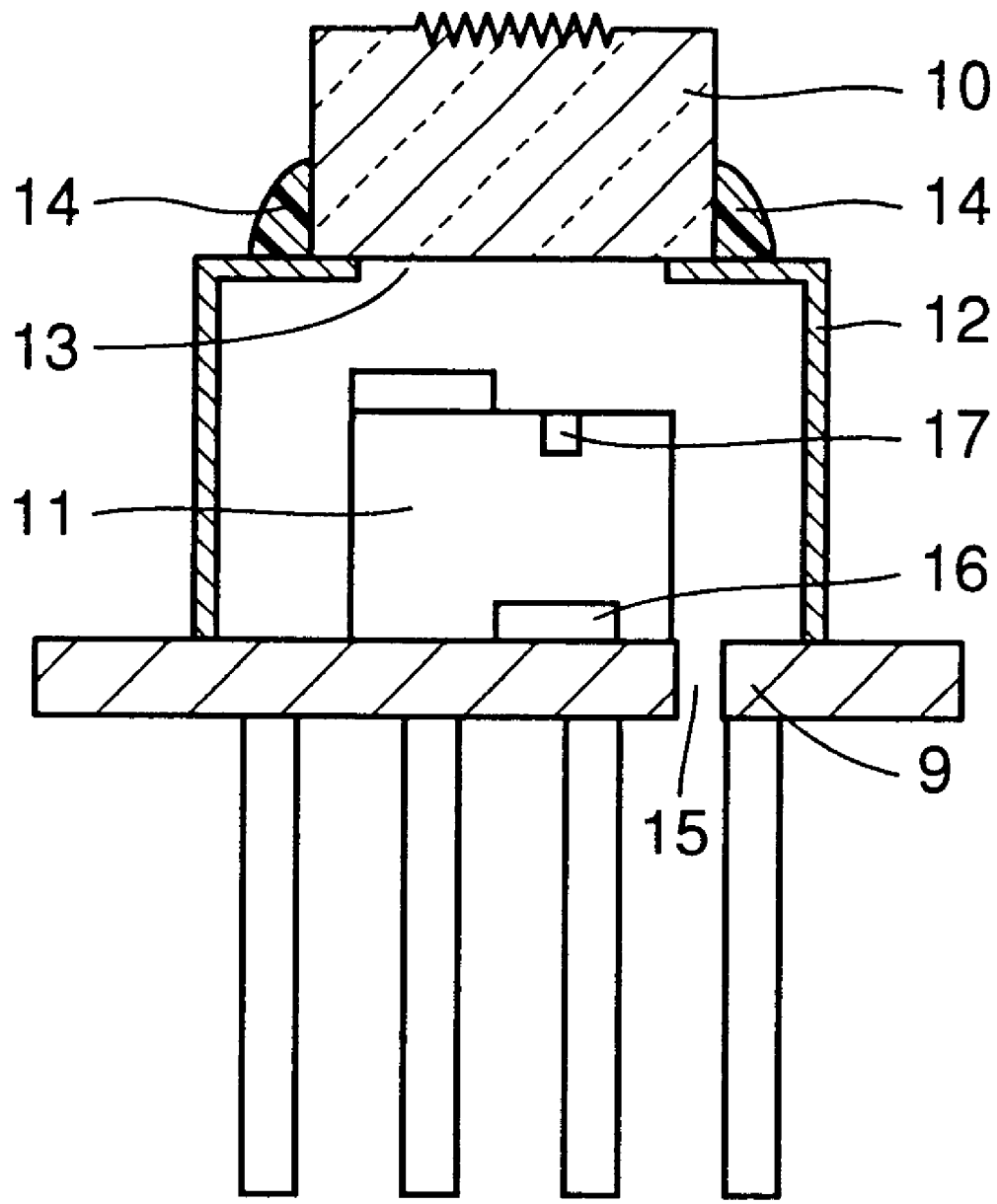
FIG. 5 is a section view of a conventional semiconductor laser device.

It is noted that the light receiving element according to the present invention is advantageous when mounted in a non-airtight package as shown in FIG. 5, and the light receiving element can be used within a device or a system other than the semiconductor laser device described above as long as it is used within such a package.

As has been described above, using the light receiving element of the present invention, the interconnection portion and the bonding wire can be electrically connected by the corrosion-resistant conductive layer even if the bonding pad portion is locally corroded, so that the corrosion resistance of the light receiving element can be enhanced. This can enhance the reliability of the light receiving element.

The semiconductor laser device according to the present invention includes the light receiving element described above, so that it can be a highly reliable semiconductor laser device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light receiving element, comprising:

a bonding pad portion;

an interconnection portion extending from said bonding pad portion;

a corrosion-resistant conductive layer formed of a corrosion-resistant material, extending from said bonding pad portion to said interconnection portion;

a bonding wire formed on said bonding pad portion; and a protection film having an opening on said bonding pad portion and covering said interconnection portion, said corrosion-resistant conductive layer extending underneath said protection film.

2. The light receiving element according to claim 1, wherein a corrosion-resistant conductive layer is formed between said bonding pad portion and said bonding wire.

3. The light receiving element according to claim 1, comprising a signal processing circuit.

4. A semiconductor laser device, comprising the light receiving element according to claim 1.

5. A light receiving element comprising:

an Al alloy layer formed on an insulating film;

a protection film having an opening on a part of a surface of said Al alloy layer and covering said Al alloy layer; and a bonding wire formed on a part of the surface of said Al alloy layer;

said Al alloy layer having a TiW layer extending from underneath said opening to underneath said protection film.

6. The light receiving element according to claim 5, wherein:

said TiW layer is formed underneath said Al alloy layer to be in contact with said insulating film; and a TiW layer and an Au layer are further formed between said Al alloy layer and said bonding wire.

7. The light receiving element according to claim 5, comprising a signal processing circuit.

8. A semiconductor laser device, comprising the light receiving element according to claim 5.

9. A light receiving element, comprising:

a bonding pad portion;

an interconnection portion extending from said bonding pad portion;

a corrosion-resistant conductive layer formed of a corrosion-resistant material, extending from said bonding pad portion to said interconnection portion;

a bonding wire formed on said bonding pad portion; and a protection film having an opening on said bonding pad portion and covering said interconnection portion, said corrosion-resistant conductive layer extending underneath said protection film, wherein said bonding pad portion and interconnection portion are formed on an insulating film; and the corrosion resistant conductive layer is arranged to be in contact with the insulating film.

\* \* \* \* \*